United States Patent
Mashimo

(10) Patent No.: US 7,800,998 B2
(45) Date of Patent: Sep. 21, 2010

(54) OPTICAL DISK AND OPTICAL DISK DRIVE

(75) Inventor: Akira Mashimo, Tokorozawa (JP)

(73) Assignee: TEAC Corporation, Tama-shi (JP)

( * ) Notice: Subject to any disclaimer, the term of this patent is extended or adjusted under 35 U.S.C. 154(b) by 1506 days.

(21) Appl. No.: 10/985,698

(22) Filed: Nov. 10, 2004

(65) Prior Publication Data
US 2005/0099927 A1 May 12, 2005

(30) Foreign Application Priority Data
Nov. 10, 2003 (JP) ............................ 2003-380232

(51) Int. Cl.
*G11B 7/00* (2006.01)
(52) U.S. Cl. .................................. 369/47.5; 369/59.24
(58) Field of Classification Search ........................ None
See application file for complete search history.

(56) References Cited

U.S. PATENT DOCUMENTS 7,355,942 B2 * 4/2008 Mashimo et al. ........... 369/47.5

2003/0053389 A1 3/2003 Mashimo

FOREIGN PATENT DOCUMENTS

JP 2001-266348 9/2001
JP 2003-91819 A 3/2003

OTHER PUBLICATIONS

English translation of JP2001-266348.*
Notice of Grounds for Rejection Against Japanese Panent Application No. 2003-380232, dated Aug. 21, 2007, issued in corresponding Japanese Application No. 2003-380232, filed Nov. 10, 2003.

* cited by examiner

*Primary Examiner*—Jorge L Ortiz Criado
(74) *Attorney, Agent, or Firm*—Christensen O'Connor Johnson Kindness PLLC

(57) ABSTRACT

An optical disk apparatus for suppressing a DSV and performing R-OPC. An encoding/decoding circuit inserts a synchronization information item to a head of a synchronous frame once when data are recorded on an optical disk. First, the encoding/decoding circuit inserts synchronization information as a mark or a space on the basis of a DSV. When the polarity of the first synchronization information item is a mark, the polarity of a next synchronization information item is also set on the basis of the DSV. When the polarity of the first synchronization information is a space, the polarity of the next synchronization information is set to a mark. R-OPC is performed at a timing when the polarity of the synchronization information is a mark.

6 Claims, 9 Drawing Sheets

| | |
|---|---|
| SY0 | 1000#0 010000 000000 001001 |
| SY1 | 10100# 010000 000000 001001 |
| SY2 | 10010# 010000 000000 001001 |
| SY3 | 00000# 010000 000000 001001 |

OPTICAL DISK AND OPTICAL DISK DRIVE

BACKGROUND OF THE INVENTION

1. Field of the Invention

The present invention relates to an optical disk and an optical disk apparatus, and, more particularly, to the configuration of synchronization information.

2. Related Art

An optical disk apparatus has hitherto optimized recording power by means of a technique called OPC (Optimum Power Control) or R-OPC (Running Optimum Power Control), thereby recording data. According to the OPC technique, test data are recorded in a test area (PCA) of the optical disk while the recording power is changed in various manners before recording of data, and the test data are reproduced. Recording power at which the quality (e.g., a β value) of the reproduced signal is optimized is selected as optimum recording power. In the meantime, according to the R-OPC technique, consideration is given to the fact that the sensitivity of a recording film of the optical disk is not necessarily uniform within the plane. When data are actually recorded at the optimum recording power determined through OPC, the quantity of return light arising at the time of recording of data is monitored. The recording power is controlled by feedback such that the quantity of return light assumes a constant value. In general, the quantity of light of level B is used as the quantity of return light. The level B represents the quantity of return light acquired as a result of formation of a pit when the optical disk is exposed to recording power (i.e., the quantity of return light arising as a result of the recording power having been diffracted by the pit). Specifically, when the quantity of return light of level B falls below a given value, this indicates that pits are formed to an excessive degree. Hence, the recording power is reduced. In contrast, when the quantity of return light of level B falls above the given value, this indicates that pits are formed to an insufficient degree, and the recording power is increased.

Data having lengths 3 T to 11 T (T is a reference clock length) are recorded on a CD-R/RW or the like. However, difficulty is encountered in monitoring the quantity of return light resulting from light being diffracted by pits having short lengths and controlling the recording power through feedback. In light of this difficulty, the quantity of return light arising at the time of recording of data having the longest pit length 11 T is detected, to thus effect R-OPC. The CD-R/RW complies with specifications of data of a length 11 T being included in the synchronization information (SYNC) and of two data sets, each having a length 11 T, successively appearing twice in each frame in all cases. Any one of the two data sets, each having a length 11 T, inevitably turns into a mark (i.e., a data set for which a pit is formed by radiation of recording power). Therefore, R-OPC is carried out periodically (i.e., at the timing of periodically-inserted synchronization information) through use of the data set having a length 11 T, thereby making an attempt to periodically optimize the recording power.

In the case of a DVD-R/RW or the like, pits are formed to lengths 3 T to 11 T as in the case of the CD-R or the like. However, a pit length 14 T is used for synchronization information. In contrast with the CD-R, the DVD-R/RW complies with specifications of data having a 14 T pit length not being successively inserted twice (i.e., a mark and a space are not inserted as a pair) but being inserted only once in one frame (93 bytes). Selection of the data set having a pit length 14 T as a mark or a space is arbitrary. For example, when all of data having a pit length 14 T are set as spaces, pits are not formed to the longest pit length 14 T, and hence R-OPC cannot be performed. Consequently, the recording power cannot be periodically optimized, which in turn poses difficulty in maintaining recording quality.

As a matter of course, R-OPC can also be considered to be enabled by means of selecting as marks all of the data having a 14 T pit length. However, when all of the data having a 14 T pit length are selected as marks, there may arise a fear of an increase in DSV, which results in an increase in low-frequency components. The DSV (Digital Sum Value) is a value determined by accumulating all bits in a sequence—which takes two statuses—from the top while one status (e.g., 1) of the bit sequence is taken as +1 and the other status (e.g., 0) of the same is taken as −1. The smaller the DSV, the smaller the low-frequency components (DC components), resulting in an improvement in recording and reproducing quality.

In view of the circumstances, Japanese Patent Laid-Open Publication No. 2003-91819 describes a technique for setting marks and spaces as synchronization information items such that they are arranged alternately. According to this technique, R-OPC, or the like, is periodically performed in accordance with the synchronization information about the marks, thereby enabling an attempt to optimize the recording power.

However, even when the synchronization information is arranged such that a mark and a space are arranged alternately, there arises a problem of the DSV not necessarily being suppressed. Specifically, the DSV is determined by synchronization information and modulated data subsequent thereto. When the polarity (i.e., being a mark or a space) of the synchronization information and the polarity of the modulated data are set such that the DSV is minimized; that is, when the synchronization information is uniformly set such that a mark and a space are arranged alternately, there arises a necessity for adjusting the DSV through use of only the modulated data, so that the DSV cannot be suppressed. Specifically, in the case of a DVD, the modulated data are of 8-16 modulation scheme. The DSV can be adjusted to a certain extent by selecting a 16-bit value which becomes an odd number for a data value 1 in accordance with an unmodulated 8-bit data, or a 16-bit value which becomes an even number for a data value 1. However, on some occasions such an adjustment is not sufficient. Particularly, when two modulated data are not prepared (i.e., a substitute conversion table is not prepared) for all of unmodulated data or when physical difficulty is encountered (e.g., two modulated data sets are prepared for 0 to 87 data sets among 0 to 255 unmodulated data sets, but only single modulated data are used for subsequent data), adjustment of the DSV becomes difficult.

Moreover, if the synchronization information is uniformly fixed such that a mark and a space are arranged alternately, areas which are to become marks arise at all times at the time of recording of data on, e.g., a rewritable optical disk, and a characteristic of the recording film will be deteriorated, thereby resulting in a fear of a decrease in the number of times data on the optical disk can be rewritten.

SUMMARY OF THE INVENTION

The present invention provides an optical disk drive and an optical disk, which solve problems; i.e., performance of R-OPC, suppression of a DSV, and prevention of deterioration of a characteristic of a recording film.

The present invention provides an optical disk apparatus comprising recording means for recording data on an optical disk by inserting synchronization information in every predetermined information unit, and synchronization information control means which sets the polarity of a first synchronization information of two successive synchronization information to a mark or a space such that a DSV is minimized and which sets the polarity of a remaining synchronization information to a mark or a space in accordance with the polarity of the first synchronization information.

The present invention suppresses a DSV by setting the polarity of the first synchronization information in accordance with the DSV. The polarity of the next synchronization information is set in accordance with the polarity of the first synchronization information. As a result, when the polarity of the first synchronization information is a space, the polarity of the next synchronization information is taken as a mark, thereby enabling performance of R-OPC at the timing of this mark. When the polarity of the first synchronization information is a mark, the polarity of the next synchronization information is taken as a space or a mark, to thus enable an attempt to further suppress the DSV. According to the present invention, polarities of subsequent synchronization information are set in accordance with the polarity of the first synchronization information. Hence, the polarities of the synchronization information are not fixed. Consequently, specific locations of the optical disk are prevented from becoming marks at all times, thereby hindering deterioration of the recording film.

The present invention provides an optical disk in which synchronization information are formed in every predetermined information unit. In this optical disk, the polarity of the first synchronization information is formed as either a mark or a space such that the DSV is minimized. The polarity of the next synchronization information is formed in accordance with the polarity of the first synchronization information. When the polarity of the first synchronization information is a mark, the polarity of the next synchronization information is formed as a mark or a space such that the DSV is minimized. When the polarity of the first synchronization information is a space, the polarity of the next synchronization information is formed as a mark at all times.

The invention will be more clearly comprehended by reference to the embodiment provided below. However, the scope of the invention is not limited to the embodiment.

DETAILED DESCRIPTION OF THE PREFERRED EMBODIMENT

Figure 1:
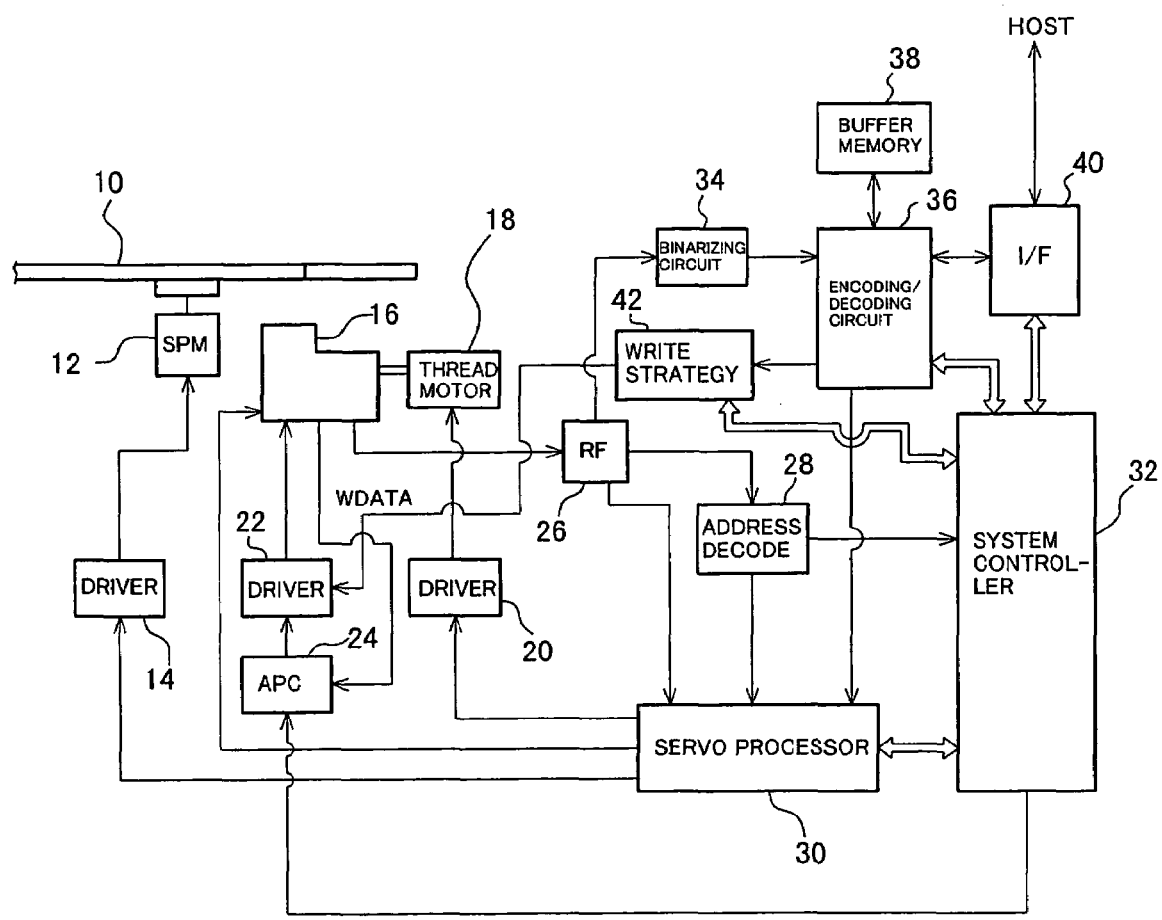
FIG. 1 is an overall block diagram of an optical disk apparatus according to an embodiment of the present invention.

FIG. 1 shows the overall block diagram of the optical disk apparatus according to the embodiment of the present invention. An optical disk 10 is rotationally driven by a spindle motor (SPM) 12. The spindle motor SPM 12 is driven by a driver 14, and the driver 14 is servo-controlled by a servo processor 30 so as to attain a desired rotational speed.

An optical pickup 16 includes a laser diode (LD) for radiating a laser beam on the optical disk 10, and a photodetector (PD) which receives the light reflected from the optical disk 10 and converts the light into an electric signal. The optical pickup 16 is disposed opposite the optical disk 10. The optical pickup 16 is driven by a thread motor 18 in a radial direction of the optical disk 10, and the thread motor 18 is driven by a driver 20. Like the driver 14, the driver 20 is servo-controlled by the servo processor 30. The LD of the optical pickup 16 is driven by a driver 22, and the driver 22 is controlled by an auto power control circuit (APC) 24 such that a drive current assumes a desired value. The APC 24 controls the drive current of the driver 22 such that optimum recording power selected through OPC (Optimum Power Control) performed in a test area (PCA) of the optical disk 10 is achieved. OPC is processing for recording test data in the PCA of the optical disk 10 while changing the recording power in a plurality of steps, evaluating the quality of a signal by reproducing the test data, and selecting recording power at which desired signal quality is acquired. A β value, a γ value, the degree of modulation, a jitter, an asymmetry, or the like, is used as signal quality.

When the data recorded in the optical disk 10 are reproduced, the laser beam of reproducing power is emitted from the LD of the optical pickup 16, and the resultant reflected light is converted into an electric signal by the PD. The thus-converted electrical signal is output. A reproduced signal output from the optical pickup 16 is supplied to the RF circuit 26. The RF circuit 26 generates a focus error signal and a tracking error signal from the reproduced signal and supplies the signals to the servo processor 30. On the basis of the error signals, the servo processor 30 servo-controls the optical pickup 16, thereby maintaining the optical pickup 16 in an on-focus state and an on-track state. The RF circuit 26 supplies an address signal included in the reproduced signal to an address decoding circuit 28. The address decoding circuit 28 demodulates address data pertaining to the optical disk from the address signal and supplies the thus-demodulated data to the servo processor 30 and a system controller 32.

The RF circuit 26 supplies a reproduced RF signal to a binarizing circuit 34. The binarizing circuit 34 binarizes the reproduced signal and supplies the resultant modulated signal to an encoding/decoding circuit 36. The encoding/decoding circuit 36 demodulates the binarized signal and subjects the demodulated signal to error correction, to thus produce reproduced data. The encoding/decoding circuit 36 outputs the reproduced data to the host, such as a personal computer, by way of an interface I/F 40. When the reproduced data are output to the host, the encoding/decoding circuit 36 temporarily stores the reproduced data in buffer memory 38 and outputs the thus-stored data.

When data are recorded on the optical disk 10, data to be recorded which are output from the host are supplied to the encoding/decoding circuit 36 by way of the interface I/F 40. The encoding/decoding circuit 36 stores the data to be recorded in the buffer memory 38, encodes the data to be recorded, and supplies the thus-encoded data as modulated data to a write strategy circuit 42. In addition to an 8-16 modulation scheme for a DVD, an 8-12 modulation scheme (ETM) for an HD-DVD or a like scheme can be used as the modulation scheme. In the present embodiment, by way of an example, the data are presumed to be modulated by the 8-12 modulation scheme. The HD-DVD is described in, e.g., pp. 125 to 134 of "Nikkei Electronics" Nikkei BP Inc., Oct. 13, 2003. Briefly, an LD having a wavelength of 405 nm is used as the light source, and data are recorded in lands and grooves of the optical disk 10 at a track pitch of about 0.4 μm. Address information is recorded through phase modulation where the phases of wobbles are brought in phase or out of phase with each other. 8-bit data formed by adding an error correction code to the data to be corrected are modulated into a 12-bit code, and the thus-modulated code is recorded on the optical disk 10. Data are recorded to lengths 2 T to 11 T, and a length 13 T exceeding the data lengths is used as synchronization information.

Two types of modulated data (a substitute conversion table) having different DSVs are prepared for data which are not yet modulated and fall within a certain range (e.g., 0 to 87), and a single modulated data set is prepared for subsequent data. It may be the case that only single modulated data are prepared for data in all ranges.

The write strategy circuit 42 converts the modulated data into a multipulse (pulse train) in accordance with a predetermined recording strategy and supplies the converted data as record data to the driver 22. The record strategy is formed from, e.g., a pulse width of a leading pulse in a multipulse train, a pulse width of a subsequent pulse, and a pulse duty. The laser beam whose power has been modulated by the record data is emitted from the LD of the optical pickup 16, whereby the data are recorded on the optical disk 10. After recording of the data, the optical pickup 16 reproduces the record data by radiating a laser beam of reproducing power and supplies the reproduced data to the RF circuit 26. The RF circuit 26 supplies a reproduced signal to the binarizing circuit 34, and binarized modulated data are supplied to the encoding/decoding circuit 36. The encoding/decoding circuit 36 decodes the modulated data and verifies the decoded data against the data recorded in the buffer memory 38. The result of verification is supplied to the system controller 32.

When data are recorded, the system controller 32 performs OPC and R-OPC. Specifically, the system controller 32 supplies test data to the encoding/decoding circuit 36 before recording the data and records the test data in an inner test area of the optical disk 10 while changing the recording power in a plurality of steps. The recorded test data are reproduced by means of the reproducing power, and optimum recording power is selected on the basis of a β value, or the like, of a reproduced RF signal. The thus-selected power is taken as recording power. Moreover, the system controller 32 periodically detects the quantity of return light arising during recording of the data and determines whether or not the level of return light (i.e., a level B) coincides with a predetermined value stored in memory beforehand. When no coincidence exists, the recording power is increased or decreased in accordance with the magnitude of the difference. Namely, when the quantity of return light is a predetermined value or less, the recording power is determined to be excessive, and hence the recording power is decreased. When the quantity of return light exceeds the predetermined value, the recording power is determined to be insufficient, and hence the recording power is increased. Alternatively, the optimum recording power Po selected through OPC and a value Bo of the level B of the quantity of light returned when the test data are recorded at the recording power Po are stored in memory. The recording power is adjusted through use of these values and the level B value detected during recording of the data such that a relationship of $Bo/Po''=B/P''$=constant (where "n" is a positive rational number) is achieved. R-OPC of the present embodiment is carried out at the time of formation of the synchronization information of a mark having the pit length 13 T. Therefore, when inserting synchronization information into the head of the synchronous frame, the encoding/decoding circuit 36 sets the polarity of the synchronous information in accordance with a predetermined rule, to thus record the synchronous information on the optical disk 10. The predetermined rule will be described later. Another configuration may also be employed. In this configuration, another synchronization information generation circuit is provided separately from the encoding/decoding circuit 36, and the synchronization information generation circuit generates synchronization information and sets the polarity thereof. The thus-generated synchronization information and the polarity thereof are supplied to the encoding/decoding circuit 36. The encoding/decoding circuit 36 may insert the synchronization information into the head of the synchronous frame.

Figures 2, 3:
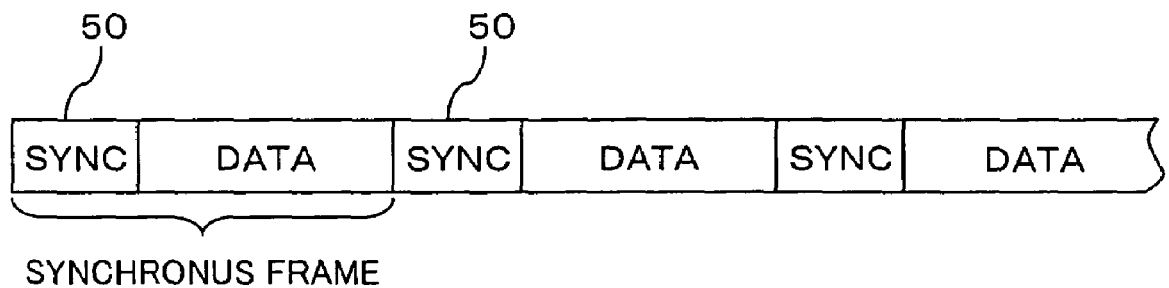
FIG. 2 is a descriptive view of a data format.
FIG. 3 is a descriptive view of the basic configuration of synchronization information.

FIG. 2 shows the configuration of physical sectors of the optical disk 10. Respective physical sectors of the optical disk 10 are formed from 26 synchronous frames, and one synchronization information item (SY or SYNC) 50 is formed at the top of each synchronous frame. A plurality of types of synchronization information items (SY) 50; e.g., four types of synchronization information items SY0 to SY3, are prepared for identifying the synchronous frames, and the respective synchronization information items 50 are formed from 24 bits each. As previously described, the 8-12 modulated data are recorded in the data portion according to an NRZI (Non-Return to Zero Inverter) scheme. The NRZI is a scheme for inverting a value immediately preceding a modulation code bit value 1 and maintaining a value immediately preceding a modulated code bit value 0. The modulated data are recorded to data lengths 2 T to 11 T or to like lengths.

The basic configuration of the synchronization information will be explained before description of the synchronization information of the present embodiment.

FIG. 3 shows examples of four types of synchronization information items SY0 to SY3 to be used for identifying a synchronization frame. Here, two types of data; that is, data having a state 0 and data having a state 1, are prepared for the respective synchronization information items SY0 to SY3. Any one is selected from the four types in accordance with an immediately-preceding code data value (an 8-12-converted code of an 8-bit unit). In the drawings, a synchronization information item of state 10 is illustrated by way of an example.

In the drawings, the synchronization information item SY0 is expressed as, e.g., 1000#0 010000 000000 001001, and "#" acts as a DSV control bit for controlling a DSV. The first seven bits 1000#0 0 constitute a variable portion including the DSV control bit. Subsequent bits 10000 000000 001001 form a fixed portion whose data value is fixed. Moreover, the synchronization information item SY1 is expressed as, e.g., 10100# 010000 000000 001001, and "#" similarly acts as a DSV control bit. Any one of 0 and 1 is set as a bit value of the DSV control bit "#." The polarity of the synchronization information is determined in conjunction with the NRZI scheme. When #=1, the synchronization information is referred to as primary synchronization information. When #=0, the synchronization information is referred to as secondary synchronization information. The configuration for preparing primary synchronization information and secondary synchronization information as synchronization information items is known in the field of, e.g., a DVD. In general, in connection with a relationship between the primary synchronization information and the secondary synchronization information, the secondary synchronization information becomes a "space" when the primary synchronization information becomes a "mark." Moreover, the secondary synchronization information becomes a "mark" when the primary synchronization information becomes a "space."

Figure 4:
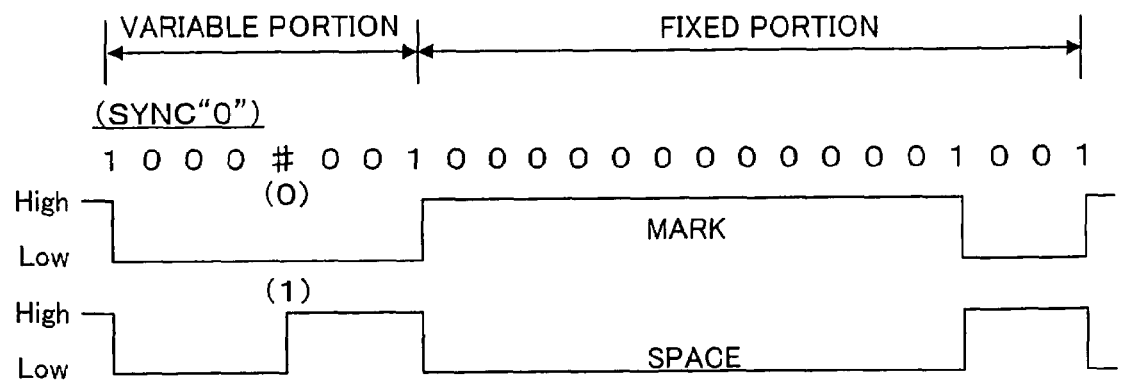
FIG. 4 is a descriptive view showing a relationship between a DSV control bit of synchronization information SY0 shown in FIG. 3 and polarities.
Figure 5:
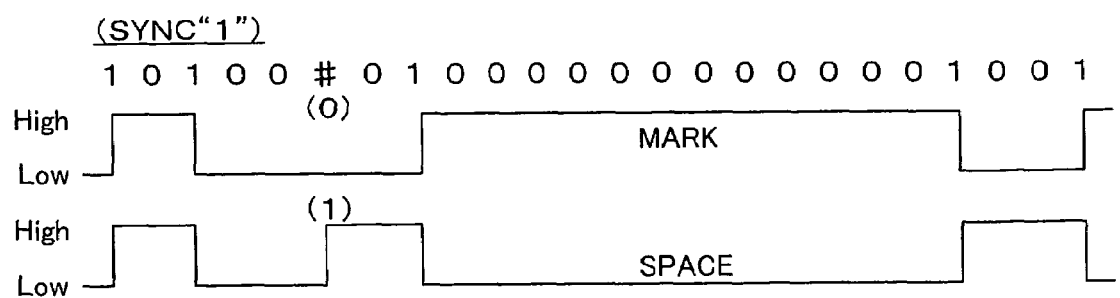
FIG. 5 is a descriptive view showing a relationship between a DSV control bit of synchronization information SY1 shown in FIG. 3 and polarities.

FIGS. 4 and 5 show a relationship between the bit value of the control bit "#" and polarities thereof. FIG. 4 shows a relationship between a DSV control bit for synchronization information SY0 and polarities thereof. When the value of the control bit "#" assumes 0, the control bit remains in 0 (Low) for maintaining an immediately-preceding value 0 (Low). At the next 1 (the first 1 of the control bit for specifying a fixed portion), the immediately-preceding value 0 (Low) is inverted to 1 (High). The synchronization information having a length 13 T is recorded as 1 (High); that is, a "mark." The mark area is exposed to a laser beam of recording power, to thus form a pit. Since the immediately-preceding value 1 (High) is again inverted at the next 1, the value turns into 0 (Low). Further, 0 (Low) is inverted at a least significant bit 1 of the synchronization information, whereupon the value turns into 1 (High).

A modulated data portion follows the synchronization information, and data are recorded while a bit 1 of the modulated data is inverted and a bit 0 of the same is maintained.

In the meantime, when the value of the control bit "#" is 1, the preceding bit value 0 (Low) is inverted, and hence the value assumes 1 (High). The preceding value 1 (High) is again inverted to 0 (Low) at the next 1 (the first 1 specifying the fixed portion), and the synchronization information having a length 13 T is recorded as 0 (Low) or a "space." Since the immediately-preceding value 0 (Low) is again inverted at the next 1, the value turns into 1 (High). Moreover, 1 (High) is inverted at the least significant bit 1 of the synchronization information to turn into 0 (Low).

FIG. 5 shows a relationship between the DSV control bit and polarities of synchronization information SY1. As in the case of the synchronization information SY0, number 1 is incremented or decremented depending on whether the bit value of "#" is 0 or 1. As mentioned above, number 1 is changed between when the DSB control bit "#" assumes 0 and when the DSB control bit "#" assumes 1. The DSV is understood to be able to be controlled by the bit value of the control bit "#."

FIGS. 4 and 5 show that the synchronization information is simultaneously determined as a mark or a space depending on the value of the control bit "#." For instance, when the value of the DSV control bit "#" is set to 1 in order to decrease the DSV of the synchronization information SY0, the synchronization information SY0 is recorded as a space. As a result, R-OPC—which is to be performed for the synchronization information about a mark for which a pit is formed by radiation of a laser beam of recording power—cannot be carried out. In contrast, when the DSV control bit "#" of certain synchronization information is set to 0 in order to carry out R-OPC, it may be a case that the DSV of data is increased.

In the present embodiment, as mentioned previously, in order to satisfy a demand for decreasing the DSV and another demand for optimizing recording power by periodically performing R-OPC as well as a demand for suppressing the number of rewriting operations, which would otherwise be caused as a result of the arrangement or layout of a mark or a space being fixed uniformly, the polarity of the synchronization information having a length 13 T is determined as follows.

Figure 6:
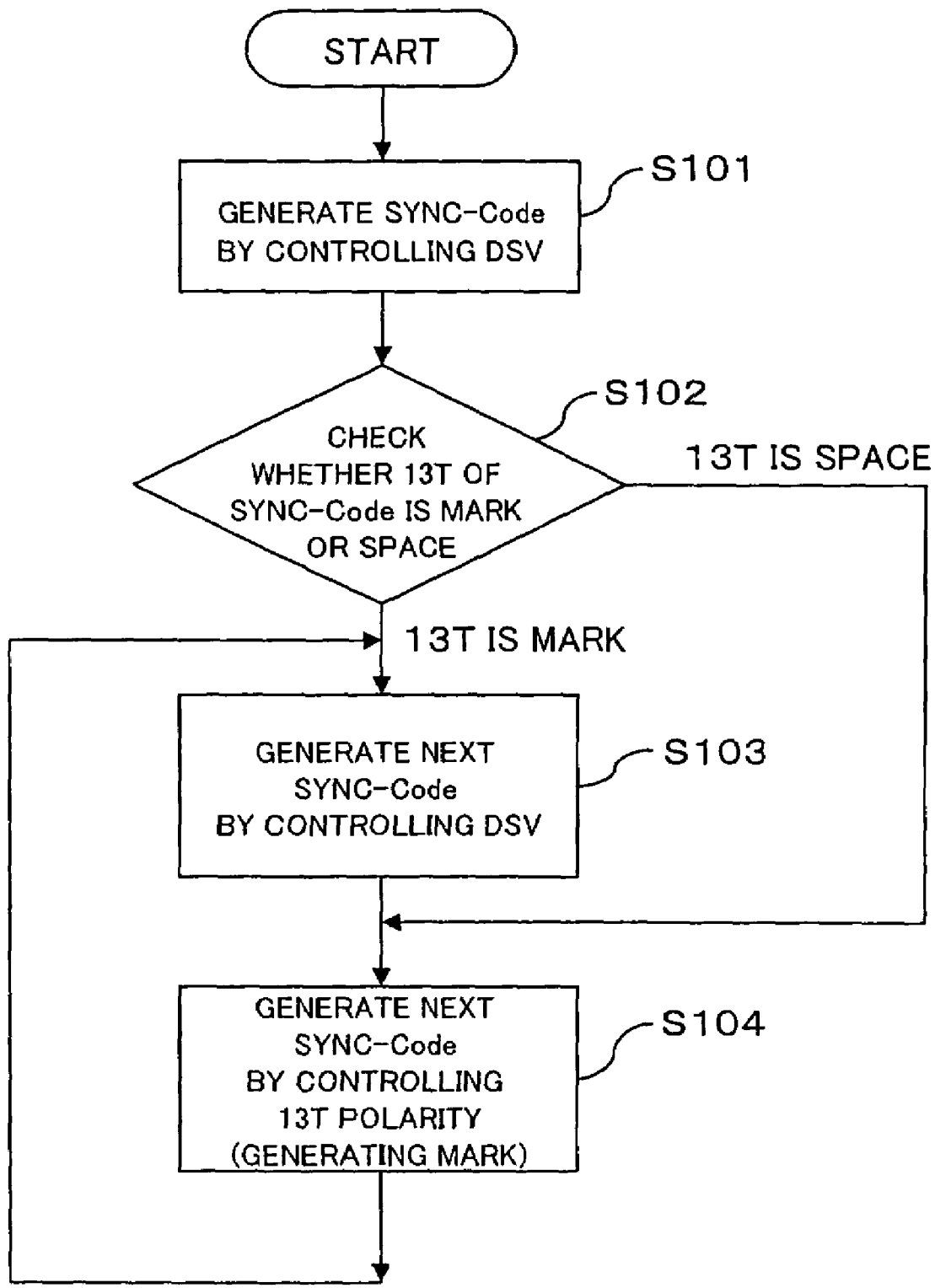
FIG. 6 is a processing flowchart of the embodiment.

FIG. 6 shows a flowchart employed when the encoding/decoding circuit 36 sets the polarity of synchronization information during recording of data. In the drawing, synchronization information is designated as "SYNC-Code."

First, when synchronization information is inserted into the head of the synchronous frame, the synchronization information is generated by means of controlling a DSV (S101). Specifically, the control bit "#" of the synchronization information is set to 0 or 1 such that the DSV is minimized. More specifically, the value of the control bit "#" of SYNC is determined such that a DSV formed from the control bit "#" of SYNC to the control bit "#" of next data assumes a polarity which decreases DSVs preceding the current DSV. A control bit "#" of certain SYNC determines a DSV of data immediately preceding the control bit "#" of the next SYNC.

A determination is made as to whether the polarity of the first synchronization information item (the polarity of information corresponding to 13 T) set through processing pertaining to S101 is a mark or a space (S102). When the polarity of the first synchronization information item is a mark, R-OPC is performed at a timing when the synchronization information is a mark, thereby adjusting the recording power. As in the case of the first synchronization information item, the polarity of the next synchronization information item (synchronization information of a second synchronization frame) is also set by means of controlling the DSV (S103). Specifically, the synchronization information item is given the polarity; that is, a mark or a space, such that the DSV is minimized. The polarity of the next synchronization information item (synchronization information of a third synchronous frame) is set so as to become a mark at all times (S104). The polarity is set in S103 in accordance with the DSV, and hence the DSV can be controlled. Moreover, as a result of the polarity of the next synchronization information item having been set so as to become a mark at all times in S104, R-OPC can be performed at the timing of this mark even when the polarity of the next synchronization information item is set as a space in S103.

Polarities of subsequent synchronization information items are set by means of repeating processing pertaining to steps S103, S104. Specifically, the polarity of a subsequent synchronization information item is set by means of controlling the DSV (S103), and the polarity of the next synchronization information item is set to a mark at all times (S104). As a result of repetition of processing pertaining to S103 and S104, the polarity of synchronization information always comes to a mark once every two times, thereby enabling performance of R-OPC and suppressing the DSV.

When the polarity of the first synchronization information item is set to a space in S102, the next synchronization information item (synchronization information of a second synchronous frame) is set so as to become a mark at all times (S104). As a result of the DSV being controlled in S102 and the polarity of the synchronization information item being set to a mark in S104, the DSV can be suppressed, and R-OPC can be performed. As mentioned previously, the polarities of subsequent synchronization information items are set by means of DSV control operation (S103), and the polarity of the next synchronization information item is always set to a mark (S104).

FIGS. 7A to 7D illustrate polarities of a series of synchronization information items set through the foregoing processing operations. Such synchronization information items are formed on the optical disk 10 of the present embodiment.

Figure 7A:
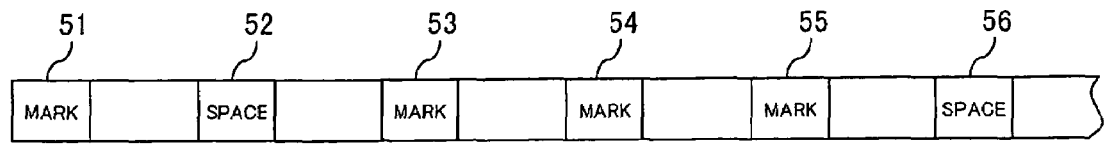
FIG. 7A is a descriptive view of the polarities of synchronization information formed through processing shown in FIG. 6.

In FIG. 7A, the polarity of a first synchronization information item 51 after initiation of recording operation is set to, e.g., a mark, by means of controlling a DSV (S101). Since the polarity of the first synchronization information item 51 (the polarity of a portion of the synchronization information corresponding to T13) is a mark, the polarity of the next synchronization information item 52 is set to, e.g., a space, by means of repetition of the DSV control operation (S103). Since the polarity of the first synchronization information item is a mark, the polarity of the next synchronization information item 53 is always set to a mark (S104). The polarity of the next synchronization information item 54 is set to, e.g., a mark, by means of the DSV control operation (S103). The polarity of the next synchronization information item 55 is always set to a mark (S104). Moreover, the polarity of the next synchronization information item 56 is set to, e.g., a space, by means of the DSV control operation (S103). The same applies to any counterparts in the following synchronization information items. Since the polarities of the synchronization information items 51, 53, 54, and 55 are set to a mark, R-OPC is performed at every timings or at some of these synchronization information items. An example selected timing is that R-OPC is performed at the timings of the synchronization information items 53, 55 because the polarities of the synchronization information items 53, 54, and 55 successively become marks three times and that R-OPC is not performed at the timing of the synchronization information item 54. When a predetermined period of time has not passed since immediately-preceding R-OPC was performed, R-OPC cannot be performed even if the polarity of the synchronization information is a mark. Since the polarities of the synchronization information items 51, 52, 54, and 56 are set such that the DSV is minimized, the DSVs are also suppressed.

Figure 7B:
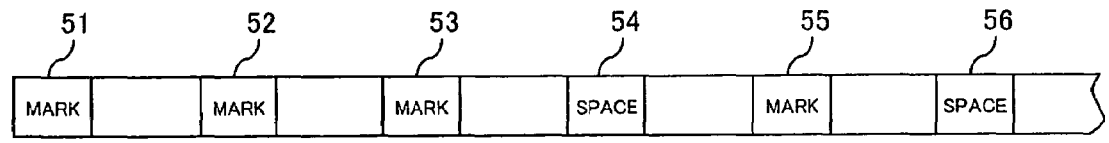
FIG. 7B is a descriptive view of the polarities of synchronization information formed through processing shown in FIG. 6.

In FIG. 7B, the polarity of the first synchronization information item 51 is set to, e.g., a mark, by means of DSV control operation (S101). The polarity of the next synchronization information item 52 is set to, e.g., a mark, by means of repetition of DSV control operation, because the polarity of the first synchronization information item 51 is a mark (S103). The polarity of the next synchronization information item 53 is always set to a mark (S104). The polarity of the next synchronization information 54 is set to, e.g., a space by means of DSV control (S103). The polarity of the next synchronization information item 55 is always set to a mark (S104). The polarity of the synchronization information 56 is set to, e.g., a space, by means of DSV control (S103). The polarities of the synchronization information items 52, 53, 54, and 56 are set to marks, and hence R-OPC is performed at the timings of these synchronization information items. The polarities of the synchronization information items 51, 53, and 55 are set such that the DSVs are minimized. Hence, the DSVs are also suppressed.

Figure 7C:
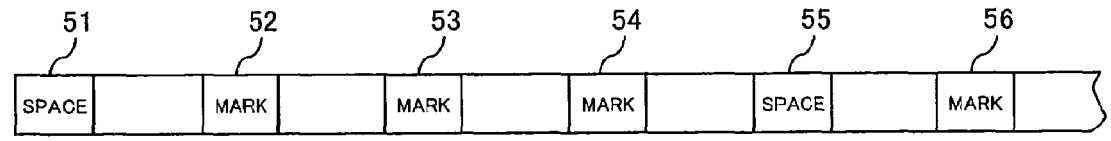
FIG. 7C is a descriptive view of the polarities of synchronization information formed through processing shown in FIG. 6.

In FIG. 7C, the polarity of the first synchronization information item 51 is set to, e.g., a space, by means of DSV control operation (S101) The polarity of the next synchronization information item 52 is always set to, e.g., a mark, because the polarity of the first synchronization information item 51 is a mark (S104). The polarity of the next synchronization information item 53 is set to, e.g., a mark, by means of DSV control (S103). The polarity of the next synchronization information 54 is always set to, e.g., a mark by means of DSV control (S103). The polarity of the next synchronization information item 55 is set to e.g., a space (S104). The polarity of the synchronization information 56 is always set to, e.g., a mark (S104). The polarities of the synchronization information items 52, 53, 54, and 56 are set to marks, and hence R-OPC is performed at the timings of these synchronization information items. The polarities of the synchronization information items 51, 53, and 55 are set such that the DSVs are minimized. Hence, the DSVs are also suppressed.

Figure 7D:
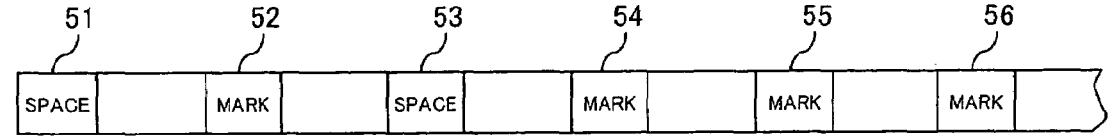
FIG. 7D is a descriptive view of the polarities of synchronization information formed through processing shown in FIG. 6.

In FIG. 7D, the polarity of the first synchronization information item 51 is set to, e.g., a space, by means of DSV control operation (S101). The polarity of the next synchronization information item 52 is always set to a mark, because the polarity of the first synchronization information item 51 is a space (S104). The polarity of the next synchronization information item 53 is set to, e.g., a space by means of DSV control operation (S103). The polarity of the next synchronization information item 54 is always set to a mark (S104). The polarity of the next synchronization information item 55 is set to, e.g., a mark, by means of DSV control operation (S103). The polarity of the next synchronization information item 56 is always set to a mark (S104). Since the polarities of the synchronization information items 52, 54, 55, and 56 are set to marks, R-OPC is performed at the timings of these synchronization information items. Further, the polarities of the synchronization information items 51, 53, and 55 are set such that the DSVs are minimized. Hence, the DSVs are suppressed as well.

As is obvious from FIGS. 7A to 7D, in the present embodiment, the method for setting a polarity of a subsequent synchronization information item is changed depending on whether the polarity of the first synchronization information item determined through DSV control is a mark or a space. For this reason, a mark and a space do not appear in a fixed pattern. Consequently, a mark does not always appear in a specific location on the optical disk 10, and deterioration of a characteristic of the recording film and a decrease in the number of rewritable operations, which would otherwise be caused by deterioration of the characteristic of the recording film, can be prevented as well.

Figure 8:
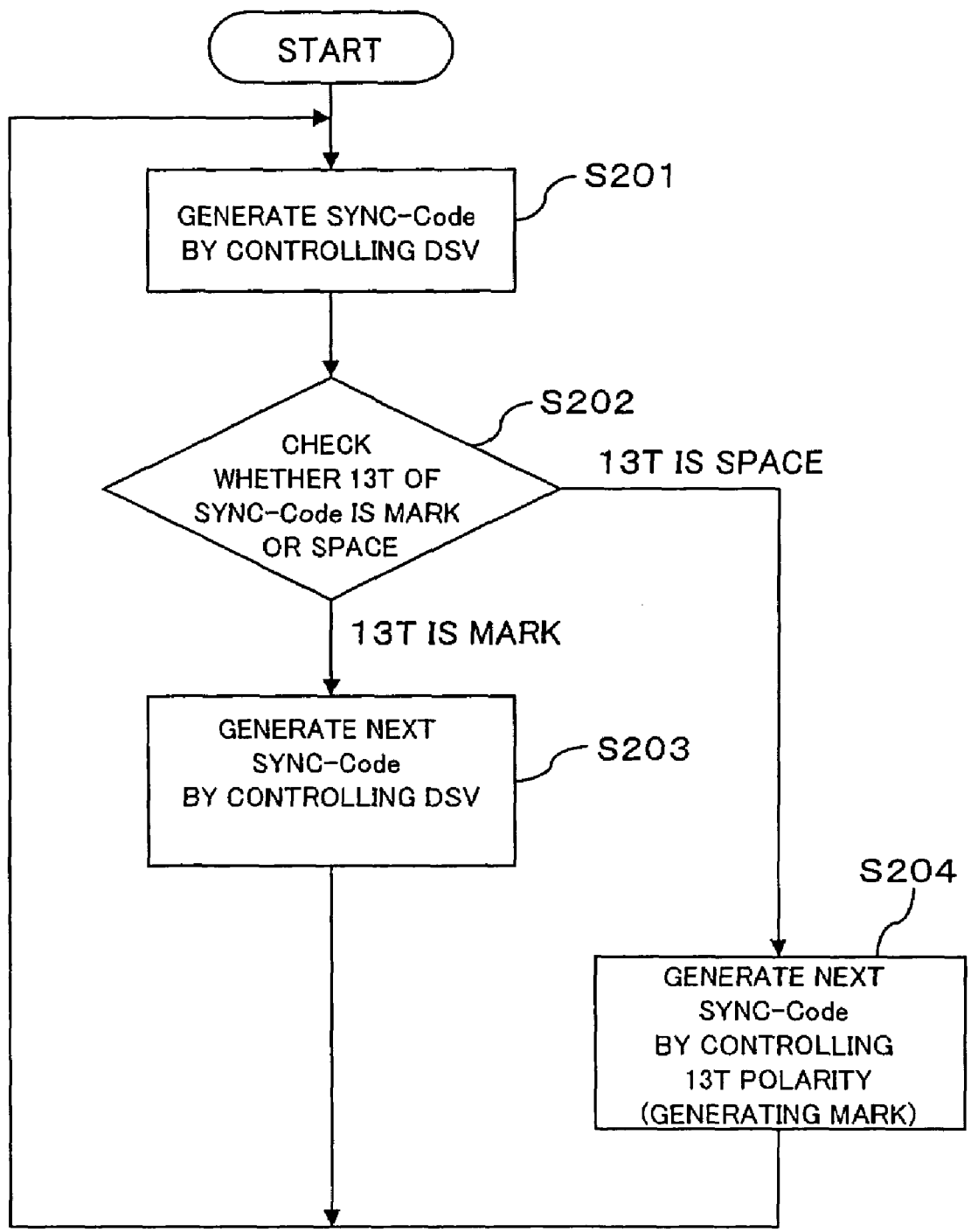
FIG. 8 is another processing flowchart of the embodiment.

FIG. 8 shows another flowchart for setting the polarity of synchronization information items performed by the encoding/decoding circuit 36.

First, at the time of insertion of synchronization information into the head of a synchronous frame, the synchronization information is generated by means of controlling a DSV (S201). Specifically, the control bit "#" of the synchronization information is set to 0 or 1 such that the DSV is minimized.

A determination is made as to whether the polarity of the first synchronization information item (the polarity of information corresponding to 13 T) set through processing pertaining to S201 is a mark or a space (S202). When the polarity of first synchronization information item is a mark, R-OPC is performed at a timing when the synchronization information item is a mark, thereby adjusting the recording power. As in the case of the first synchronization information item, the polarity of the next synchronization information item (synchronization information of a second synchronization frame) is also set by means of controlling the DSV (S203). Specifically, the synchronization information is given the polarity; that is, a mark or a space, such that the DSV is minimized. R-OPC can be performed on at least the first mark, and the DSV can be suppressed by means of the next DSV control operation.

When the polarity of the first synchronization information item is a space in S202, the next synchronization information item (synchronization information of the second synchronous frame) is set so as to become a mark at all times (S204). The DSV control operation is performed in S202, and the polarity of the next synchronization information item is set to a mark in S204, thereby enabling suppression of the DSV and performance of R-OPC.

Polarities of subsequent synchronization information items are set by means of repeating processing pertaining to steps S201 to S204. As a result of repetition of these processing operations, the polarity of synchronization information always comes to a mark once every two times, thereby enabling performance of R-OPC. Moreover, the polarity of synchronization information is set by means of DSV control operation at least once every two times, and hence the DSV can be suppressed.

FIGS. 9A to 9D illustrate polarities of a series of synchronization information items set through the foregoing processing operations.

Figure 9A:
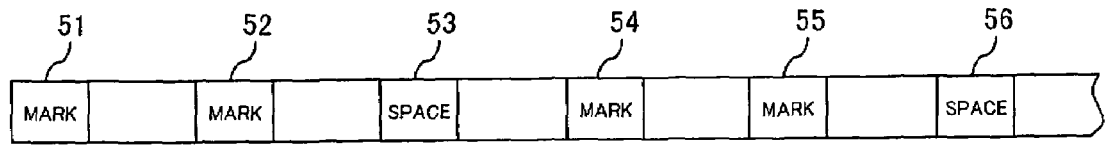
FIG. 9A is a descriptive view of the polarities of synchronization information formed through processing shown in FIG. 8.

In FIG. 9A, the polarity of the first synchronization information item 51 at the time of initiation of recording operation is set to, e.g., a mark, by means of controlling a DSV (S201). Since the polarity of the first synchronization information item 51 (the polarity of a portion of the synchronization information corresponding to T13) is a mark, the polarity of the next synchronization information item 52 is set to, e.g., a mark, by means of repetition of the DSV control operation (S203). The polarity of the next synchronization information item 53 is set to, e.g., a space, by means of DSV control operation (S201). The polarity of the next synchronization information item 54 is always set to a mark (S204). The polarity of the next synchronization information item 55 is set to, e.g., a mark by repetition of DSV control operation (S201). Moreover, the polarity of the next synchronization information item 56 is set to, e.g., a space, by means of the DSV control operation (S203). Since the polarities of the synchronization information items 51, 52, 54, and 55 are set to marks, R-OPC is performed at the timings of these synchronization information items. Moreover, since the polarities of the synchronization information items 51, 52, 53, 55, and 56 are set such that the DSV is minimized, the DSVs are also suppressed.

Figure 9B:
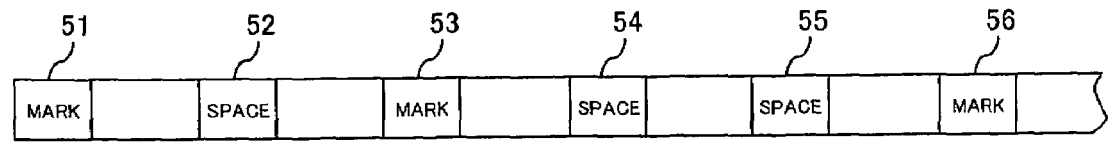
FIG. 9B is a descriptive view of the polarities of synchronization information formed through processing shown in FIG. 8.

In FIG. 9B, the polarity of the first synchronization information item 51 is set to, e.g., a mark, by means of controlling a DSV (S201). Since the polarity of the first synchronization information item 51 (the polarity of a portion of the synchronization information corresponding to T13) is a mark, the polarity of the next synchronization information item 52 is set to, e.g., a space, by means of repetition of the DSV control operation (S203). the polarity of the next synchronization information item 53 is set to, e.g., a mark, by means of DSV control (S201). The polarity of the next synchronization information item 54 is set to, e.g., a space, by means of a repetition of DSV control operation (S203). The polarity of the next synchronization information item 55 is set to, e.g., a space by means of DSV control (S201). The polarity of the next synchronization information item 56 is always set to a mark (S204). Since the polarities of the synchronization information items 51, 53, and 56 are set to marks, R-OPC is performed at the timings of these synchronization information items. Moreover, since the polarities of the synchronization information items 51, 52, 53, 54, and 55 are set such that the DSV is minimized, the DSVs are also suppressed.

Figure 9C:
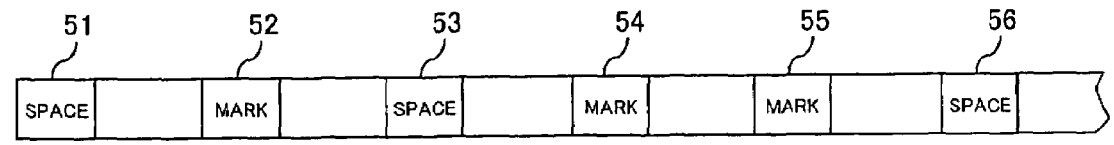
FIG. 9C is a descriptive view of the polarities of synchronization information formed through processing shown in FIG. 8.

In FIG. 9C, the polarity of the first synchronization information item 51 is set to, e.g., a space, by means of controlling a DSV (S201). Since the polarity of the first synchronization information item 51 is a space, the polarity of the next synchronization information item 52 is always set to a mark (S204). The polarity of the next synchronization information item 53 is set to, e.g., a space, by means of DSV control operation (S201). The polarity of the next synchronization information item 54 is always set to a mark (S204). The polarity of the next synchronization information item 55 is set to, e.g., a mark by a repeat of DSV control operation (S201). Moreover, the polarity of the next synchronization information item 56 is set to, e.g., a space, by means of the DSV control operation (S203). Since the polarities of the synchronization information items 52, 54, and 55 are set to marks, R-OPC is performed at the timings of these synchronization information items. Moreover, since the polarities of the synchronization information items 51, 53, 55, and 56 are set such that the DSV is minimized, the DSVs are also suppressed.

Figure 9D:
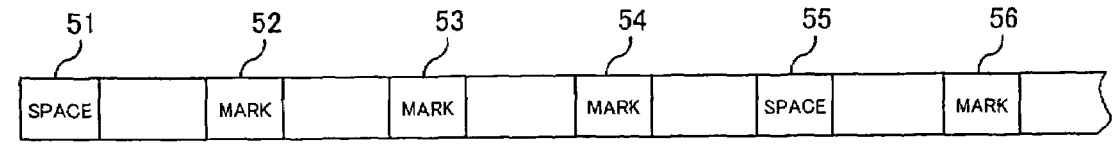
FIG. 9D is a descriptive view of the polarities of synchronization information formed through processing shown in FIG. 8.

In FIG. 9D, the polarity of the first synchronization information item 51 is set to, e.g., a space, by means of controlling a DSV (S201). Since the polarity of the first synchronization information item 51 is a space, the polarity of the next synchronization information item 52 is always set to a mark (S204). The polarity of the next synchronization information item 53 is set to, e.g., a mark, by means of DSV control operation (S201). The polarity of the next synchronization information item 54 is always set to a mark (S203). The polarity of the next synchronization information item 55 is set to, e.g., a space by repetition of DSV control operation (S201). Moreover, the polarity of the next synchronization information item 56 is always set to a mark (S204). Since the polarities of the synchronization information items 52, 53, 54, and 56 are set to marks, R-OPC is performed at the timings of these synchronization information items. Moreover, since the polarities of the synchronization information items 51, 53, 54, and 55 are set such that the DSV is minimized, the DSVs are also suppressed.

As is obvious from FIGS. 9A to 9D, in the present embodiment, the method for setting a polarity of a subsequent synchronization information item is changed depending on whether the polarity of the first synchronization information item determined through DSV control is a mark or a space. For this reason, a mark and a space do not appear in a fixed pattern. Consequently, a mark does not always appear in a specific location on the optical disk 10, and deterioration of a characteristic of the recording film and a decrease in the number of rewritable operations, which would otherwise be caused by deterioration of the characteristic of the recording film, can be prevented as well.

Figure 10:
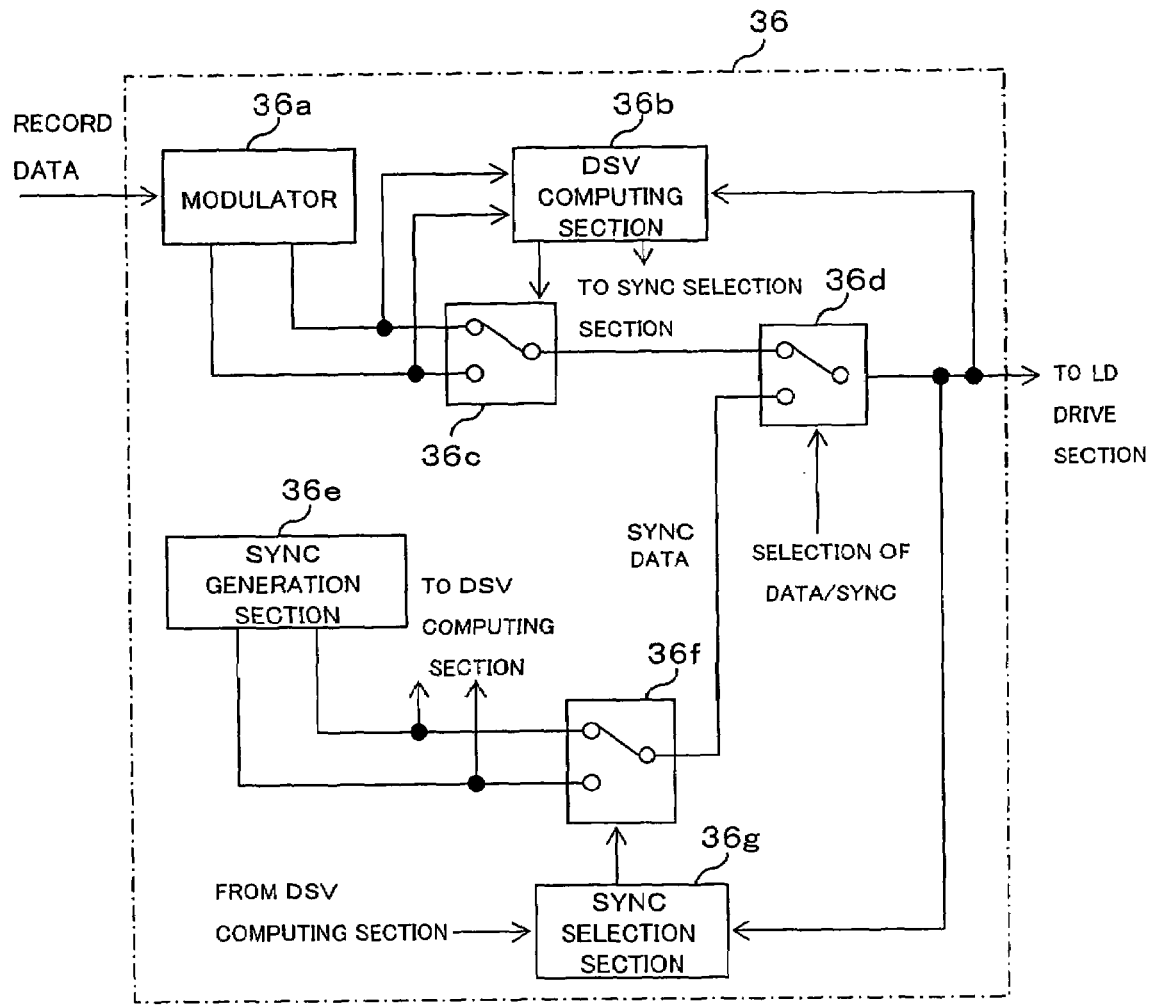
FIG. 10 is a block diagram showing the configuration of an encoding circuit.

FIG. 10 shows an example of a circuit configuration for inserting and recording synchronization information according to the above-described rule. This circuit is to be embedded in the encoding section of the encoding/decoding circuit 36 shown in FIG. 1.

The encoding section of the encoding/decoding circuit 36 is formed from a modulator 36a, a DSV computing section 36b, a SYNC generation section 36e, a SYNC selection section 36g, and selection switches 36c, 36d, and 36f.

The modulator 36a subjects the record data output from the buffer 38 to 8-12 conversion to thus generate signals 2 T to 11 T and supplies the thus-generated signals to the selection switch 36c. The modulator 36a generates two types of data sets according to the value of the record data and supplies the generated data to the selection switch 36c.

The DSV computing section 36b computes the modulated data supplied to the optical pickup 16; that is, the DSV of the data to be recorded in the optical disk 10, and supplies a selection signal to the selection switch 36c on the basis of the computing result, thereby selecting modulated data. The modulated data selected by the selection switch 36c on the basis of the DSV are then supplied to the selection switch 36d. There may also be adopted a configuration where the modulated data are supplied in unmodified form to the selection switch 36d without the selection switch 36c.

The selection switch 36d is a switch for switching between the modulated data and the synchronization information and performs switching operation in accordance with wobble address detected data (data/SYNC selection data) output from the system controller 32 and a clock signal. When the wobble address detected data are output from the system controller 32 and a predetermined clock is counted on the basis of the address detected data, the time is determined to be a timing when any of SY0 to SY3 is inserted as synchronization information, and hence the selection switch 35d is switched to a position for SYNC data, to thus output the synchronization information. At any timing other than that timing, the selection switch 36d is switched to a position for the modulated data supplied from the selection switch 36c, thereby outputting the modulated data to the optical pickup 16. As a result, the synchronization information items SY0 to SY3 are inserted to synchronization positions. The modulated data/SYNC output from the selection switch 36d are supplied to the write strategy circuit 42 after having been converted into an NRZI scheme, and the data are further supplied to the LD drive section. After having been converted into the NRZI scheme by the write strategy circuit 42, the data/SYNC may be supplied to the LD drive section.

The SYNC generation section 36e is for generating synchronization information having a length 13 T; generates synchronization information patterns where the polarity of the synchronization information comes to a mark and a space, in connection with respective synchronization information items SY0 to SY3; and supplies the thus-generated synchronization information patterns to the selection switch 36f. Specifically, synchronization information patterns of "100000 010000 000000 001001" (in the case of #=0) and "100010 010000 000000 001001" (in the case of #=1) are generated for SY0. Synchronization information patterns of "101000 010000 000000 001001" (in the case of #=0) and "101001 010000 000000 001001" (in the case of #=1) are generated for SY1. These synchronization information patterns are supplied to the selection switch 36f. The thus-generated synchronization information patterns are supplied to the DSV computing section 36b, as well. In these respective cases, DSVs are computed.

The selection switch 36f is a switch for selecting any one of two synchronization information patterns in relation to each of SY0 to SY3. Selection of the synchronization information pattern is controlled by the SYNC selection section 36g. The SYNC selection section 36g selects either a mark or a space in accordance with any of the processing flowcharts shown in FIG. 6 or 8.

For instance, in the case of the processing shown in FIG. 6, a contact point of the selection switch 36f is switched so as to select either a mark or a space output from the SYNC generation section 36e in accordance with the DSV supplied from the DSV computing section 36b. The result of selection of a polarity is stored in internal memory of the SYNC selection section 36g. When a mark has been selected the last time, the SYNC selection section 36g switches the contact point of the selection switch 36f, at the timing of insertion of the next synchronization information, so as to again select either the mark or the space in accordance with the DSV supplied from the DSV computing section 36b. The contact point of the selection switch 36f is switched, at the timing of insertion of the next synchronization information, so as to select a mark at all times regardless of the DSV supplied from the DSV computing section 36b.

When the space is selected last time, the SYNC selection section 36g switches the contact point of the selection switch 36f so as to select a mark at all times regardless of the DSV supplied from the DSV computing section 36b. In subsequent steps, the SYNC selection section 36g selects either a mark or a space on the basis of the DSV and switches the contact point of the selection switch 36f so as to select a mark at all times at the timing when the next synchronization information is inserted.

In the case of the processing shown in FIG. 8, the SYNC selection section 36g selects either a mark or a space on the basis of the DSV supplied from the DSV computing section 36b, thereby switching the contact point of the selection switch 36f. The result of selection of a polarity is stored in internal memory of the SYNC selection section 36g. When the space has been selected the last time, the SYNC selection section 36g switches the contact point of the selection switch 36f, at the timing of insertion of the next synchronization information, so as to again select either a mark or a space in accordance with the DSV supplied from the DSV computing section 36b. In contrast, when the space has been selected the last time, the contact point of the selection switch 36f is switched so as to select a mark at all times regardless of the DSV supplied from the DSV computing section 36b. In subsequent steps, the previously-described selection processing is repeated.

The foregoing operation of the SYNC selection section 36g is achieved by sequentially executing the processing program. The operation can also be achieved by the system controller 32 fulfilling the function of the SYNC selection section 36, or the operation can be executed by the SYNC selection section 36g in response to a command from the system controller 32.

By means of the foregoing processing operations, R-OPC can be performed at a sufficiently short cycle by means of the mark of synchronization information. Moreover, data recording involving a small DSV becomes feasible. The arrangement of a mark and a space is not fixed, and hence a mark is prevented from appearing in a specific location at all times, thereby preventing occurrence of a decrease in the number of rewritable operations.

Figure 11:
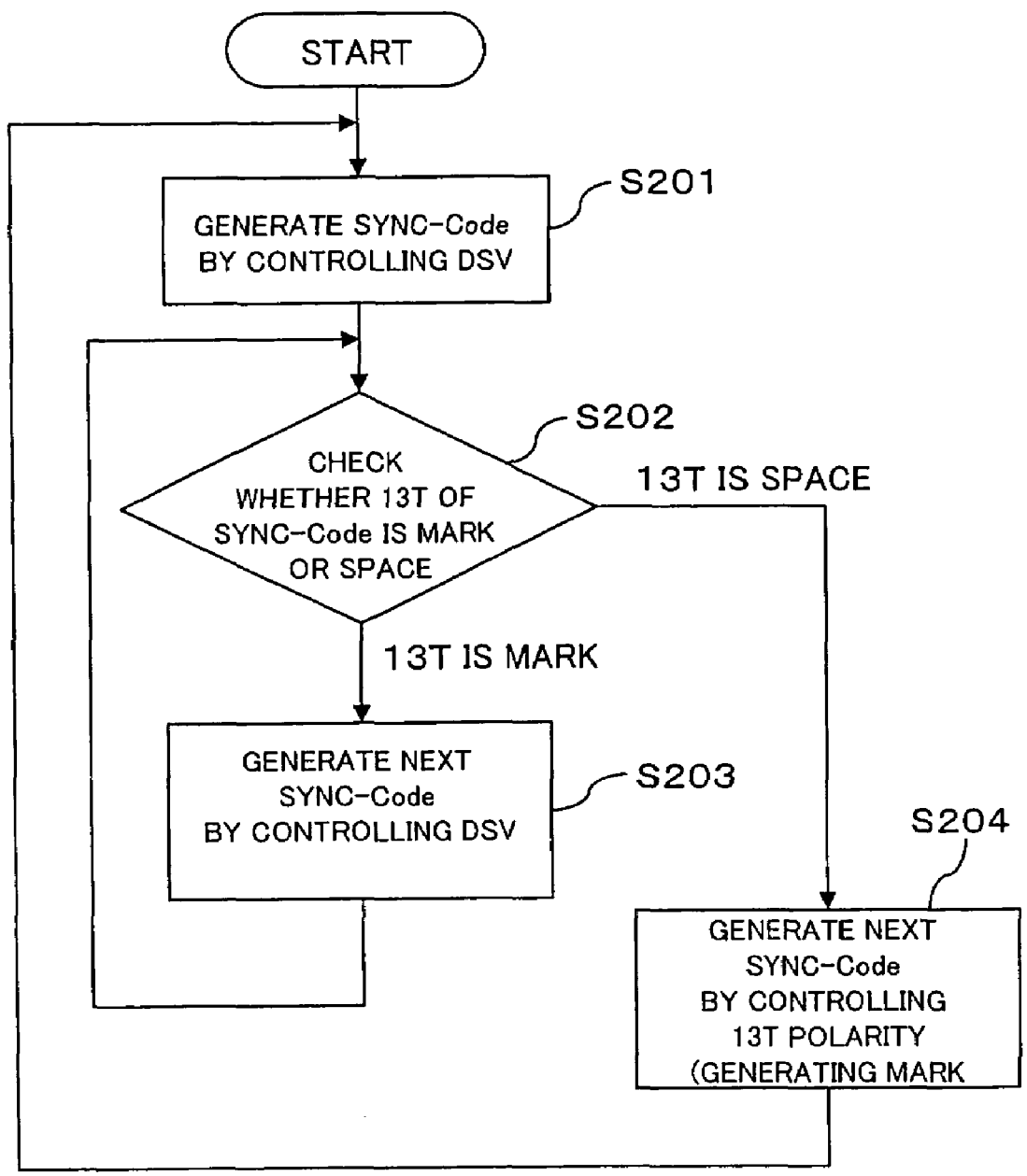
FIG. 11 is yet another processing flowchart of the embodiment.

Although the embodiment of the present invention has been described, the present invention is not limited to this embodiment and is susceptible to various modifications. FIG. 11 shows an example modification of the embodiment. This modification is essentially analogous to the processing shown in FIG. 8. After the polarity of the next synchronization information item has been generated by means of controlling DSV in S203, processing returns to S202, where a determination is made as to whether the polarity is a mark or a space. When the polarity is a mark, synchronization information is generated by means of again controlling the DSV. When the polarity is a space, the next synchronization information is generated so as to become a mark at all times (S204). In sum, the polarity of the synchronization information is determined by means of controlling the DSV. When the result of control of the DSV shows that the polarity of the synchronization information item is a mark, the polarity of the next synchronization information item is determined by means of again controlling the DSV. When the polarity is a space, the polarity is set so as to become a mark at all times. Return of processing to the DSV control operation is then repeated. When three successive synchronization information items are assumed to be taken as a first synchronization information item, a second synchronization information item, and a third synchronization information item, respectively, the polarity of the first synchronization information is set to a mark or a space such that the DSV is minimized. When the polarity of the first synchronization information item is a mark, the polarity of the second synchronization information item following the first synchronization information item is set to a mark or a space such that the DSV is minimized. When the polarity of the first synchronization information item is a space, the polarity of the second synchronization information item is set so as to become a mark at all times. When the polarity of the second synchronization information item is set such that the DSV is minimized, the polarity of the third synchronization information item following the second synchronization information is set in accordance with the polarity of the second synchronization information item. Specifically, when the polarity of the second synchronization information item is a mark, the polarity of the third synchronization information item is again set to a mark or a space such that the DSV is minimized. When the polarity of the second synchronization information item is a space, the polarity of the third synchronization information item is set to a mark at all times. Moreover, when the polarity of the second synchronization information item is always set to a mark, the polarity of the third synchronization information item is set to a mark or a space such that the DSV is minimized. Even in this case, a mark inevitably appears after the synchronization information item having the polarity of a space, thereby enabling performance of R-OPC and suppression of the DSV.

What is claimed is:

1. An optical disk apparatus comprising: recording means for recording data on an optical disk by inserting synchronization information in every predetermined information unit; and synchronization information control means which sets a polarity of a first synchronization information of two successive synchronization information to a mark or a space such that a Digital Sum Value is minimized and which sets a polarity of a second synchronization information to a mark or a space in accordance with the polarity of said first synchronization information; and, when the polarity of said first synchronization information is a mark, said synchronization information control means sets the polarity of said second synchronization information to a polarity at which said Digital Sum Value is minimized and sets the polarity of a next synchronization information to a mark; and, when the polarity of said first synchronization information is a space, said synchronization information control means always sets the polarity of said second synchronization information to a mark.

2. An optical disk apparatus comprising:
recording means for recording data on an optical disk by inserting synchronization information once every synchronous frame; and
synchronization control means for controlling the polarity of said synchronization information, wherein
said synchronization control means sets a polarity of a first synchronization information to a mark or a space such that a Digital Sum Value is minimized;
said synchronization control means sets a polarity of a next synchronization information to a mark or a space such that said Digital Sum Value is minimized when the polarity of said first synchronization information is a mark, and always sets the polarity of said next synchronization information to a mark when the polarity of the first synchronization information is a space.

3. The optical disk apparatus according to claim 2, wherein said synchronization information has length of 13 T, wherein T is a reference clock length.

4. The optical disk apparatus according to claim 2, further comprising: means for adjusting the power of a recording laser beam on the basis of the quantity of light returned from said optical disk at a timing at which the polarity of said synchronization information is set to a mark.

5. An optical disk apparatus comprising:
recording means for recording data on an optical disk by inserting synchronization information once every synchronous frame; and
synchronization control means for controlling the polarity of said synchronization information, wherein
said synchronization control means sets the polarity of a first synchronization information to a mark or a space such that a DSV is minimized;
said synchronization control means sets to a mark or a space the polarity of a second synchronization information subsequent to said first synchronization information such that said DSV is minimized when the polarity of said first synchronization information is a mark, and always sets the polarity of said second synchronization information to a mark when the polarity of said first synchronization information is a space; and
said synchronization control means sets the polarity of a third synchronization information subsequent to said second polarity information to a mark or a space such that said DSV is again minimized when the polarity of said second synchronization information is set such that said DSV is minimized and sets to a mark, always sets the polarity of said third synchronization information to a mark when the polarity of said second synchronization information is a space, and sets the polarity of said third synchronization information to a mark or a space such that said DSV is minimized when the polarity of said second synchronization information is always set to a mark.

6. An optical disk in which synchronization information is formed for each predetermined information unit, wherein
a polarity of a first synchronization information is formed as a mark or a space such that a Digital Sum Value is minimized;
a polarity of a next synchronization information is formed in accordance with the polarity of said first synchronization information;
the polarity of the next synchronization information is formed as a mark or a space such that said Digital Sum Value is minimized when the polarity of said first synchronization information is a mark; and
the polarity of the next synchronization information is always formed as a mark when the polarity of said first synchronization information is a space.

* * * * *